(12) United States Patent
Fujimori

(10) Patent No.: US 10,582,098 B2
(45) Date of Patent: Mar. 3, 2020

(54) IMAGE PICKUP APPARATUS

(71) Applicant: OLYMPUS CORPORATION, Tokyo (JP)

(72) Inventor: Noriyuki Fujimori, Suwa (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 15/785,525

(22) Filed: Oct. 17, 2017

(65) Prior Publication Data

US 2018/0041671 A1 Feb. 8, 2018

Related U.S. Application Data

(63) Continuation of application No. PCT/JP2015/061866, filed on Apr. 17, 2015.

(51) Int. Cl.
*H04N 5/225* (2006.01)
*G02B 23/24* (2006.01)
(Continued)

(52) U.S. Cl.
CPC .......... *H04N 5/2253* (2013.01); *G02B 23/24* (2013.01); *H01L 27/14* (2013.01);
(Continued)

(58) Field of Classification Search
CPC ...... H04N 5/2253; H04N 5/225; H04N 5/335; G02B 23/24; G02B 23/2484; H01L 27/14; H01L 27/14618; H01L 27/14636
See application file for complete search history.

(56) References Cited

U.S. PATENT DOCUMENTS

2001/0040639 A1* 11/2001 Iwasaki ............ H01L 27/14601
348/374
2004/0130640 A1 7/2004 Fujimori
(Continued)

FOREIGN PATENT DOCUMENTS

CN 101521169 A 9/2009
EP 1 577 950 A1 9/2005
(Continued)

OTHER PUBLICATIONS

International Search Report dated Jun. 23, 2015 issued in International Application No. PCT/JP2015/061866.
(Continued)

*Primary Examiner* — Twyler L Haskins
*Assistant Examiner* — Fayez Bhuiyan
(74) *Attorney, Agent, or Firm* — Scully, Scott, Murphy & Presser, P.C.

(57) ABSTRACT

An image pickup apparatus includes: an image pickup device including: a light receiving section configured to receive light entering from a light receiving surface; and a plurality of convex electrodes disposed on an opposing surface; an optical system configured to condense the light on the light receiving section; and a wiring board including a plurality of bonded terminals on a main surface, the plurality of bonded terminals respectively bonded to the plurality of convex electrodes, wherein the plurality of convex electrodes are not arranged in a light receiving section facing region that faces a region provided with the light receiving section.

10 Claims, 3 Drawing Sheets

(51) Int. Cl.
   *H01L 27/14*   (2006.01)
   *H04N 5/335*   (2011.01)
   *H01L 27/146*  (2006.01)

(52) U.S. Cl.
   CPC .. *H01L 27/14618* (2013.01); *H01L 27/14636* (2013.01); *H04N 5/225* (2013.01); *H04N 5/335* (2013.01); *G02B 23/2484* (2013.01)

(56) References Cited

U.S. PATENT DOCUMENTS

| | | |
|---|---|---|
| 2006/0249737 A1 | 11/2006 | Fujimori |
| 2007/0019952 A1 | 1/2007 | Fujimori |
| 2008/0185603 A1 | 8/2008 | Itoi et al. |
| 2009/0146234 A1 | 6/2009 | Luo et al. |
| 2009/0212425 A1 | 8/2009 | Ito et al. |
| 2011/0285003 A1 | 11/2011 | Itoi et al. |
| 2012/0074541 A1 | 3/2012 | Ito et al. |
| 2014/0015600 A1 | 1/2014 | Sato |
| 2015/0085094 A1 | 3/2015 | Fujimori et al. |
| 2015/0340397 A1* | 11/2015 | Seo .................. H01L 27/14623 257/432 |

FOREIGN PATENT DOCUMENTS

| | | |
|---|---|---|
| EP | 1 909 488 A1 | 4/2008 |
| EP | 2 614 766 A1 | 7/2013 |
| EP | 2 790 218 A1 | 10/2014 |
| JP | 2004-207461 A | 7/2004 |
| JP | 2007-036481 A | 2/2007 |
| JP | 2008-219854 A | 9/2008 |
| JP | 2008-270650 A | 11/2008 |
| JP | 2010-273757 A | 12/2010 |
| JP | 2013-125954 A | 6/2013 |
| JP | 2013-197501 A | 9/2013 |
| JP | 2014-022402 A | 2/2014 |
| JP | 2014-094237 A | 5/2014 |
| WO | 2004/059740 A1 | 7/2004 |
| WO | 2007/013214 A1 | 2/2007 |
| WO | 2014/065099 A1 | 5/2014 |

OTHER PUBLICATIONS

Extended Supplementary European Search Report dated Nov. 29, 2018 in European Patent Application No. 15 88 9228.1.

* cited by examiner

IMAGE PICKUP APPARATUS

CROSS REFERENCE TO RELATED APPLICATION

This application is a continuation application of PCT/JP2015/061866 filed on Apr. 17, 2015, the entire contents of which are incorporated herein by this reference.

BACKGROUND OF THE INVENTION

1. Field of the Invention

The present invention relates to an image pickup apparatus including: an image pickup device including convex electrodes on an opposing surface facing a light receiving surface; and a wiring board including bonded terminals bonded to the convex electrodes.

2. Description of the Related Art

A CSP (chip size package) type image pickup apparatus with a size in plan view substantially equivalent to a size in plan view of an image pickup device is small, and particularly, the diameter is small. Therefore, the CSP type image pickup apparatus is used in a distal end portion of an electronic endoscope.

For example, Japanese Patent Application Laid-Open Publication No. 2007-36481 discloses a CSP-type image pickup apparatus in which a cover glass is adhered to a light receiving surface of an image pickup device. In the CSP-type image pickup apparatus, the light receiving surface provided with a light receiving section is covered by the cover glass, and bump electrodes electrically connected to the light receiving section are disposed on an opposing surface (back side) facing the light receiving surface. The bump electrodes made of solder balls, gold bumps, or the like are bonded to electrode pads of the circuit board. In the image pickup apparatus, a plurality of bump electrodes are aligned in a lattice pattern on the opposing surface.

SUMMARY OF THE INVENTION

An embodiment of the present invention provides an image pickup apparatus including: an image pickup device including: a light receiving section configured to receive light entering from a light receiving surface; and a plurality of convex electrodes disposed on an opposing surface that faces the light receiving surface; an optical system configured to condense the light on the light receiving section; and a wiring board including a plurality of bonded terminals on a main surface, the plurality of bonded terminals being respectively bonded to the plurality of convex electrodes, wherein the plurality of convex electrodes are not arranged in a light receiving section facing region that faces a region provided with the light receiving section.

DETAILED DESCRIPTION OF THE PREFERRED EMBODIMENT(S)

First Embodiment

Figure 1:
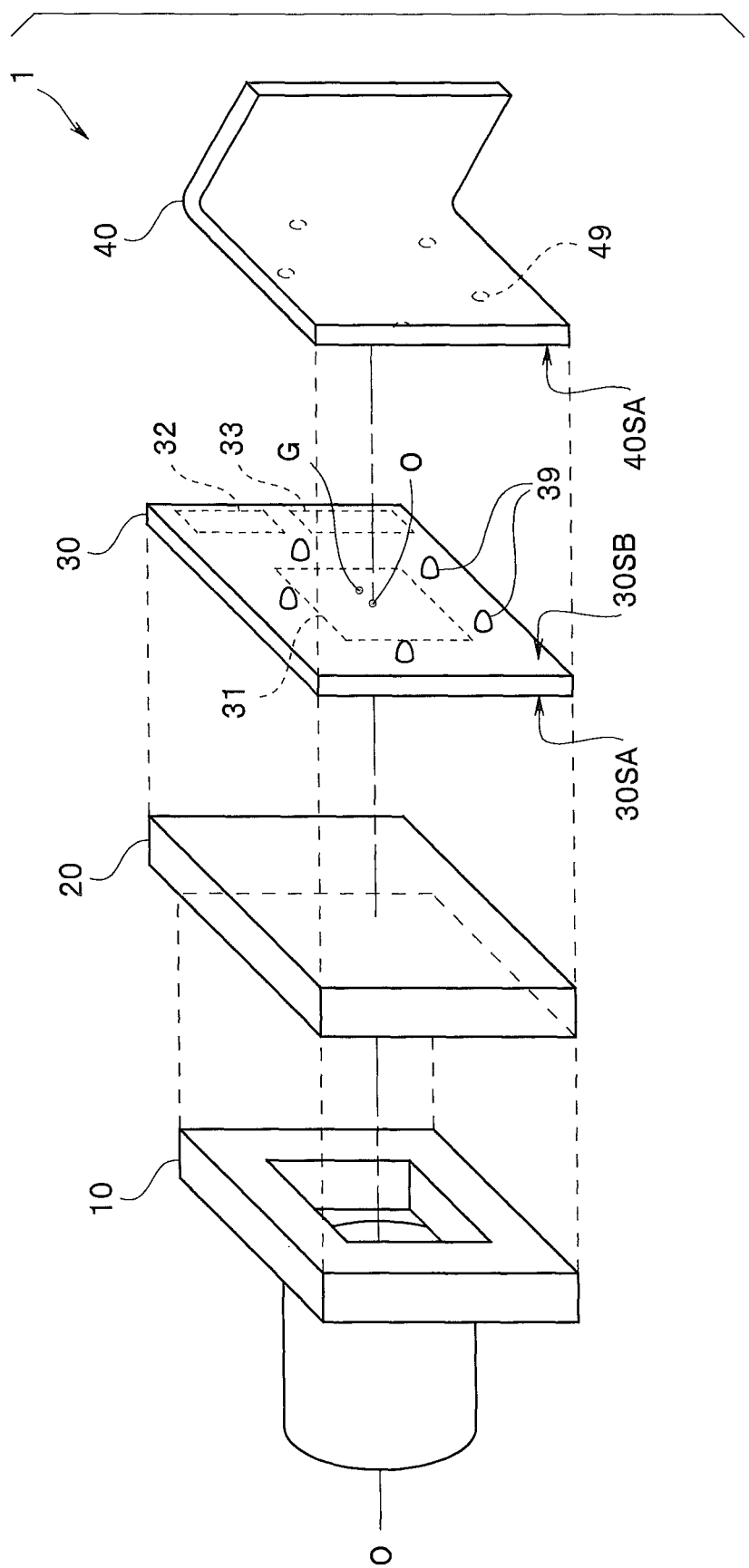
FIG. 1 is an exploded view of an image pickup apparatus according to a first embodiment.
Figure 2:
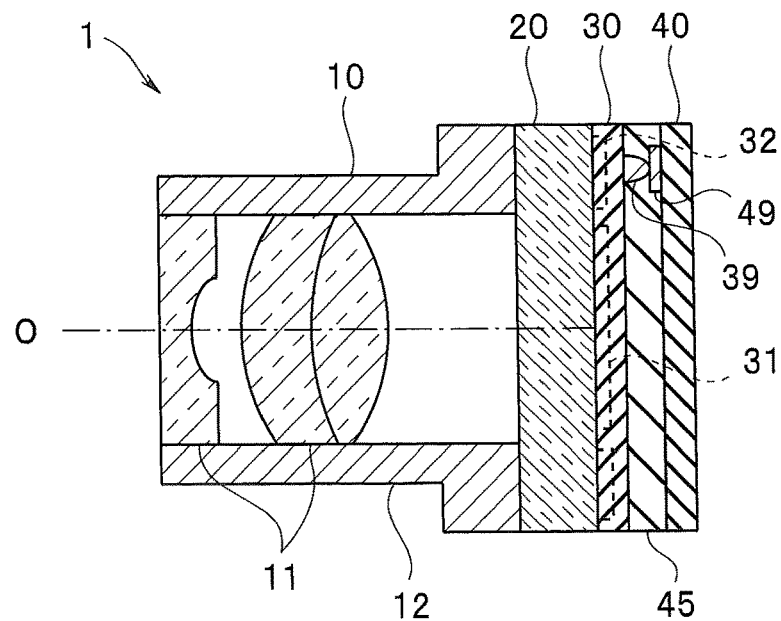
FIG. 2 is a cross-sectional view of the image pickup apparatus according to the first embodiment.
Figure 3:
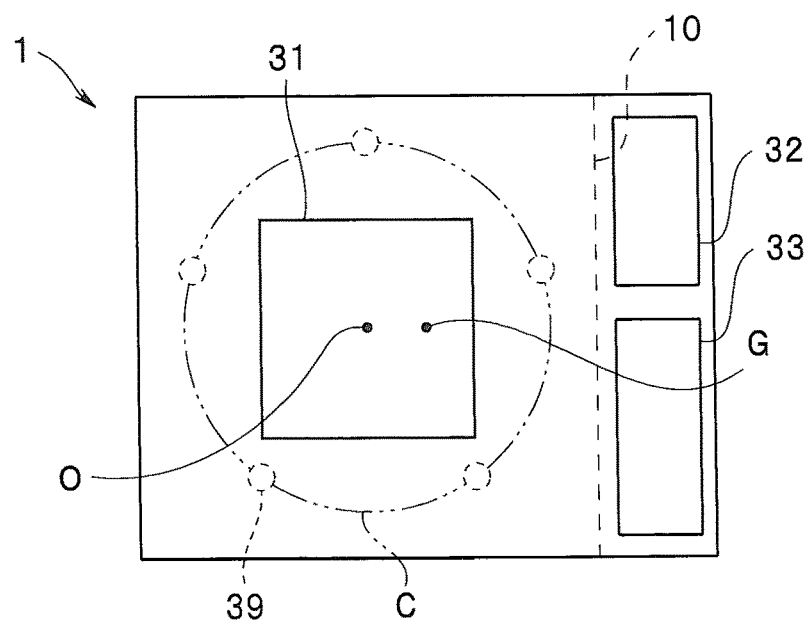
FIG. 3 is a top view of an image pickup device of the image pickup apparatus according to the first embodiment.

As shown in FIGS. 1 to 3, an image pickup apparatus 1 according to a first embodiment of the present invention includes an optical system 10, a cover member 20, an image pickup device 30, and a wiring board 40. Note that in the following description, drawings based on respective embodiments are schematic drawings, and a relationship between thickness and width of each part, a ratio of thickness and a relative angle of respective parts, and the like are different from the reality. The relationship or the ratio of dimensions between the drawings may be different in some parts of the drawings.

The image pickup device 30 constituted by a semiconductor made of silicon or the like is a CCD, CMOS image pickup device or the like and is provided with a light receiving section 31 that is a pixel area for receiving light entering from a light receiving surface 30SA. In addition, an analog circuit 33 configured to process an analog signal outputted by the light receiving section 31 and a digital circuit 32 configured to process a digitized signal are formed around the light receiving section 31 of the image pickup device 30. Note that the light receiving section 31 is also an analog circuit. Note that the image pickup device 30 may be front-side illumination (FSI) or may be back-side illumination (BSI).

A plurality of convex electrodes 39 are disposed on an opposing surface (back side) 30SB facing the light receiving surface 30SA of the image pickup device 30. The height of the convex electrodes 39 is 5 μm or more and 100 μm or less, and the diameter is 5 μm or more and 100 μm or less, for example. The convex electrodes 39 are electrically connected to the light receiving section 31 via through wiring or the like not shown. The convex electrodes 39 are made of solder balls, gold bumps, or the like.

The cover member 20 protects the image pickup device 30 without inhibiting the light reception of the light receiving section 31. The cover member 20 is made of a light-transmitting member such as light-transmitting glass or resin.

The optical system 10 includes: a lens 11 configured to condense light from an object on the light receiving section 31; and a frame member 12 configured to hold the lens 11. The lens 11 condenses the light from the object and forms an image on the light receiving section 31. Note that the lens 11 included in the optical system 10 may be a single lens or may be a combination of a plurality of lenses.

The wiring board 40 is made of one of a rigid wiring board and a flexible substrate or a combination of the rigid wiring board and the flexible substrate. The wiring board 40 includes a plurality of bonded terminals 49 on a main surface 40SA. The arrangement of the plurality of bonded terminals 49 corresponds to the arrangement of the plurality of convex electrodes 39 of the image pickup device 30 to be bonded.

Note that a sealing resin 45 is disposed between the image pickup device 30 and the wiring board 40 as shown in FIG. 2.

As a result of intensive studies, the inventor has found out that generation of a defective product, such as defective pixels, in the bonding process of the image pickup device 30 and the wiring board 40 is caused by stress imposed by the convex electrodes 39 on the light receiving section 31 of the image pickup device 30, and the inventor has completed the present invention.

At the bonding, the pressure applied from the wiring board 40 to the opposing surface 30SB of the image pickup device 30 is concentrated on an upper surface (vertex) of the convex electrode 39. Consequently, strong stress is applied to a lower part of the bonded terminal 49. When the light receiving section 31 is formed on the lower part of the bonded terminal 49, the strength of the photoelectrically converted signal may be changed by the stress, or minute light receiving pixels may be damaged.

The influence of the stress is prominent when the thickness of the image pickup device 30 is 1 mm or less, particularly, 50 μm or less as in the back-side illumination image pickup device.

Note that the bonding process becomes simple if the convex electrodes 39 and the bonded terminals 49 can be bonded by soldering. However, the influence of thermal stress is also exerted.

Therefore, in the image pickup apparatus 1 according to the embodiment of the present invention, five convex electrodes 39 are not arranged in a light receiving section facing region of the opposing surface 30SB facing a region provided with the light receiving section 31 as shown in FIG. 3.

The generation of defects at the bonding is significantly reduced in the image pickup apparatus 1 in which the convex electrodes 39 are not arranged in the light receiving section facing region. That is, the yield of the image pickup apparatus 1 is high.

Note that to further reduce the influence of the stress on the light receiving section 31, it is preferable to arrange three or more convex electrodes 39 at rotationally symmetric positions about an optical axis O of the optical system 10.

As shown in FIG. 3, in the image pickup apparatus 1, five convex electrodes 39 are arranged at rotationally symmetric positions about the optical axis O, that is, circumferentially arranged on a circle C at even intervals. In other words, the five convex electrodes 39 are arranged at vertices of an equilateral pentagon. Obviously, the convex electrodes 39 are not arranged on the light receiving section 31 and an analog circuit facing region that faces the analog circuit 33.

When the convex electrodes 39 are arranged at rotationally symmetric positions about the optical axis O, the stress applied from the convex electrodes 39 to the light receiving section 31 can be made uniform. Therefore, the image pickup apparatus 1 has a higher yield and is highly reliable.

Here, as shown in FIG. 3, a center of gravity G of the external shape of the opposing surface 30SB in the image pickup apparatus 1 is eccentric to a point where the optical axis O intersects with the opposing surface 30SB. Note that the center of gravity G is an intersection point of diagonals of the opposing surface 30SB of the rectangular image pickup device 30.

In a conventional CSP-type image pickup apparatus, the plurality of convex electrodes 39 are uniformly arranged on the entire opposing surface 30SB regardless of the position of the optical axis O. On the other hand, in the image pickup apparatus 1, the plurality of convex electrodes 39 are arranged based on the optical axis O, that is, the center of the light receiving section 31, to make uniform the stress imposed by the convex electrodes 39.

Furthermore, as shown in FIGS. 1 and 3, the external dimension of the frame member 12 of the optical system 10 is smaller than the cover member 20 and the image pickup device 30 in the image pickup apparatus 1. Therefore, the frame member 12 is not disposed on part of the front surface of the cover member 20.

The image pickup apparatus provided with the image pickup device including the bump electrodes on the opposing surface may become a defective product in a process of bonding the bump electrodes to the circuit board, and a manufacturing yield may not be high. Furthermore, when stress is applied to the image pickup apparatus, the stress tends to be concentrated on bonding sections of the bump electrodes and the circuit board, and this contributes to a reduction in reliability.

In contrast, the frame member 12 of the optical system 10 is disposed based on the position of the optical axis O, that is, the arrangement position of the plurality of convex electrodes 39. Therefore, bending stress in a lateral direction applied to the frame member 12 is equally applied to the plurality of convex electrodes 39. Therefore, the connection reliability of the plurality of convex electrodes 39 and the wiring board 40 is excellent in the image pickup apparatus 1.

Modifications of First Embodiment

Next, image pickup apparatuses according to modifications of the image pickup apparatus 1 of the first embodiment will be described. The image pickup apparatuses of the modifications are similar to the image pickup apparatus 1 and have the same advantageous effects as the image pickup apparatus 1. Therefore, the same reference signs are provided to the constituent elements with the same functions, and the description will not be repeated.

Modification 1

Figure 4A:
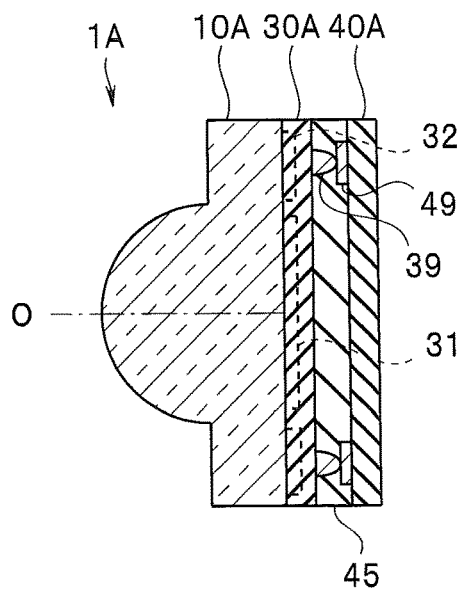
FIG. 4A is a cross-sectional view of an image pickup apparatus according to modification 1 of the first embodiment.
Figure 4B:
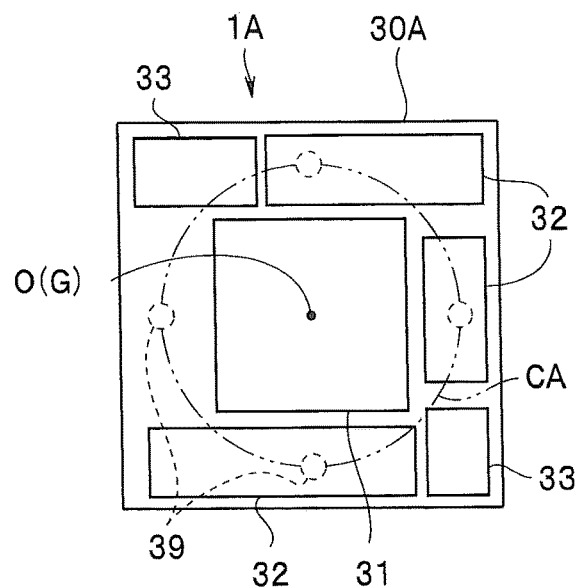
FIG. 4B is a top view of an image pickup device of the image pickup apparatus according to modification 1 of the first embodiment.

As shown in FIGS. 4A and 4B, an image pickup apparatus 1A of modification 1 includes an optical system 10A, an image pickup device 30A, and a wiring board 40A. Here, the optical system 10A functions as a cover member. That is, the image pickup apparatus 1A is produced by cutting a bonded wafer in which a glass wafer including a plurality of optical systems 10A is adhered to a semiconductor wafer including a plurality of image pickup devices 30A. The image pickup apparatus 1A produced by wafer level optics does not include a cover member just for protection.

Here, in the image pickup apparatus 1, all of the convex electrodes 39 are arranged in the non-circuit facing region that faces the non-circuit region not provided with a complicated semiconductor circuit in consideration of the stress from the bonded terminals 49. However, arranging a necessary number of convex electrodes 39 only in the non-circuit facing region is not easy in the very small image pickup device 30 in which the length of the short side is, for example, 10 mm or less, particularly, 5 mm or less.

The inventor has found out that the digital circuit 32 is less affected by the stress than the analog circuit 33. Therefore, in the image pickup apparatus 1A, the convex electrodes 39 are disposed in part of a digital circuit facing region that faces the digital circuit 32 in the opposing surface 30SB.

In other words, in the image pickup apparatus 1A, the convex electrodes 39 are not arranged in the analog circuit facing region that faces the region provided with the analog circuit 33, but are arranged in at least part of the digital circuit facing region that faces the region provided with the digital circuit 32.

The degree of freedom in arranging the convex electrodes 39 is higher in the image pickup apparatus 1A than in the image pickup apparatus 1, and the image pickup apparatus 1A can be easily downsized.

Note that in the case of the back-side illumination image pickup device, the analog circuit configured to input and output the signal is formed on the rear side of the light receiving section 31, and other than the light receiving section facing region, the analog facing region may not exist. In this case, the image pickup apparatus 1A has substantially the same configuration as the image pickup apparatus 1.

Furthermore, four convex electrodes 39 are arranged in a region other than the analog circuit facing region in the opposing surface 30SB, at rotationally symmetric positions about the optical axis O, that is, circumferentially arranged on a circle CA at even intervals. The four convex electrodes 39 are arranged at vertices of a square. Note that in FIG. 4B, the point where optical axis O intersects with the opposing surface 30SB coincides with the center of gravity G of the external shape of the opposing surface 30SB.

Note that even when the optical system and the cover member are included as in the image pickup apparatus 1, the image pickup apparatus not provided with the convex electrodes 39 in the analog circuit facing region that faces the region provided with the analog circuit 33 including the light receiving section 31 obviously has the same advantageous effects as the image pickup apparatus 1.

Modification 2

Figure 5:
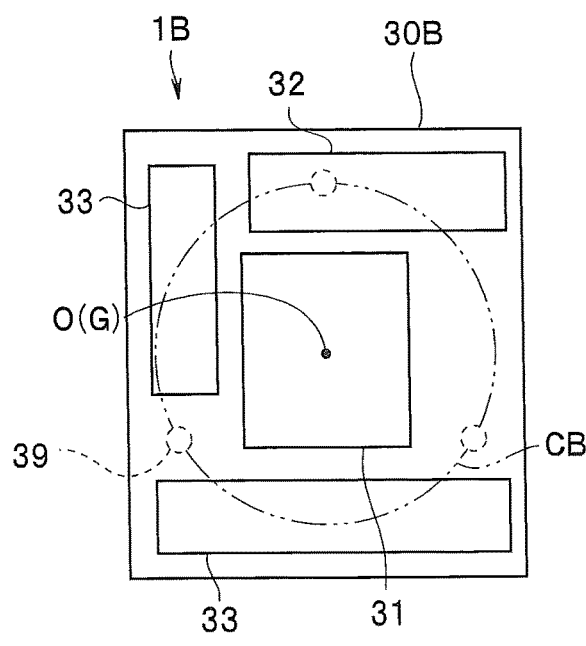
FIG. 5 is a top view of an image pickup device of an image pickup apparatus according to modification 2 of the first embodiment.

As shown in FIG. 5, an image pickup apparatus 1B of modification 2 includes an image pickup device 30B in place of the image pickup device 30A of the image pickup apparatus 1A of modification 1. Three convex electrodes 39 are arranged in a region other than the analog circuit facing region, at rotationally symmetric positions about the optical axis O, that is, circumferentially arranged on a circle CB at even intervals. The three convex electrodes 39 are arranged at vertices of an equilateral triangle.

When three or more convex electrodes 39 are arranged at rotationally symmetric positions, the influence of the stress on the light receiving section 31 can be equalized.

Therefore, when only two convex electrodes 39 are required in the specifications of the image pickup device, convex electrodes not connected to the light receiving section 31 or dummy electrodes connected to other convex electrodes are disposed to produce an image pickup device including three or more convex electrodes 39. The dimension of the dummy electrodes is obviously the same as the dimension of the convex electrodes 39.

That is, in the image pickup apparatus of the embodiment, the plurality of convex electrodes 39 may include dummy electrodes with the same potential as the other convex electrodes or dummy electrodes not connected to the light receiving section.

Note that the larger the number of convex electrodes is, the more the stress is made uniform. Therefore, it is pref-erable to further dispose dummy electrodes even if the image pickup device includes three or more convex electrodes 39. It is preferable that the number of convex electrodes 39 be four or more, particularly, six or more. The upper limit of the number of convex electrodes 39 is, for example, twelve or less, although the upper limit increases or decreases depending on the area of the opposing surface 30SB and the like.

Modification 3

Figure 6:
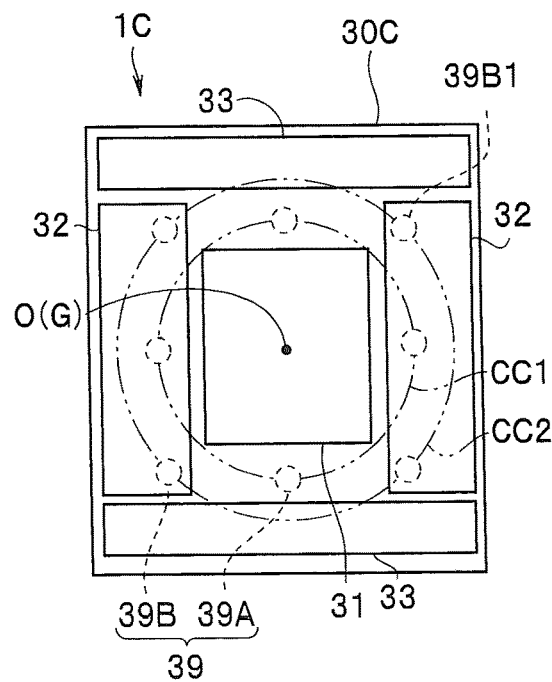
FIG. 6 is a top view of an image pickup device of an image pickup apparatus according to modification 3 of the first embodiment.

As shown in FIG. 6, an image pickup apparatus 1C of modification 3 includes an image pickup device 30C in place of the image pickup device 30A of the image pickup apparatus 1A of modification 1 and includes: four first convex electrodes 39A arranged on a first circumference CC1 about the optical axis O; and four second convex electrodes 39B arranged on a second circumference CC2.

The four first convex electrodes 39A and the four second convex electrodes 39B are arranged rotationally symmetrically with respect to each other. Furthermore, the first convex electrodes 39A and the second convex electrodes 39B are arranged at positions farthest from each other in order to level the pressure on the light receiving section 31.

Note that a second convex electrode 39B1 is a dummy electrode already described. That is, the second convex electrode 39B1 is an electrode not electrically connected to the light receiving section 31 and configured to make the stress uniform.

The image pickup apparatus in which the plurality of convex electrodes 39 include three or more first convex electrodes 39A arranged on the first circumference about the optical axis O of the optical system and three or more second convex electrodes 39B arranged on the second circumference further allows to arrange more convex electrodes in a region other than the analog circuit facing region in the opposing surface 30SB with a narrow area.

Note that the number of first convex electrodes 39A and the number of second convex electrodes 39B may be different.

Obviously, a plurality of convex electrodes may be further arranged on a third circumference coaxial with the first circumference and the second circumference.

Note that the present invention is not limited to the embodiment described above and can be appropriately modified without opposing the gist or idea of the invention read from the scope of claims and the entire description, and the illumination device system accompanied by such a modification is also included in the technical scope of the present invention.

What is claimed is:
1. An image pickup apparatus comprising:
an image pickup sensor comprising: a pixel area configured to receive light incident on a light receiving surface; and a plurality of convex electrodes disposed on an opposing surface that faces the light receiving surface;
an optical system comprising one or more lenses configured to condense the light on the pixel area;
a cover member adhered to the light receiving surface and made of a light-transmitting material; and
a wiring board comprising a plurality of bonded terminals on a main surface, the plurality of bonded terminals being respectively bonded to the plurality of convex electrodes, wherein the plurality of convex electrodes are not arranged in a pixel area facing region that faces a region provided with the pixel area, a thickness of the image pickup sensor is 50 µm or less, the plurality of convex electrodes are made of solder;

an analog circuit configured to process an analog signal output by the image sensor and a digital circuit configured to process a digitized signal are formed on the image pickup sensor, and the plurality of convex electrodes are not arranged in an analog circuit facing region that faces a region provided with the analog circuit, and the plurality of convex electrodes are arranged in at least part of a digital circuit facing region that faces a region provided with the digital circuit.

2. The image pickup apparatus according to claim 1, wherein three or more of the plurality of convex electrodes are arranged at rotationally symmetric positions about an optical axis of the optical system.

3. The image pickup apparatus according to claim 2, wherein the plurality of convex electrodes comprise: three or more first convex electrodes arranged on a first circumference about the optical axis of the optical system; and three or more second convex electrodes arranged on a second circumference about the optical axis of the optical system.

4. The image pickup apparatus according to claim 1, wherein a center of gravity of the opposing surface of the image pickup sensor is eccentric to a point where the optical axis of the optical system intersects with the opposing surface.

5. The image pickup apparatus according to claim 1, further comprising a frame for holding the optical system, the frame being disposed on an upper part of a peripheral region of the light receiving surface that faces disposition positions of the plurality of convex electrodes.

6. The image pickup apparatus according to claim 1, wherein the plurality of convex electrodes and the plurality of bonded terminals are bonded by soldering.

7. The image pickup apparatus according to claim 1, wherein the plurality of convex electrodes comprise convex electrodes with a same potential as other convex electrodes or dummy electrodes not connected to the pixel area.

8. The image pickup apparatus according to claim 2, wherein all of the three or more of the plurality of convex electrodes are arranged on a circumference about the optical axis of the optical system at even intervals.

9. The image pickup apparatus according to claim 8, wherein an odd number of the plurality of convex electrodes are arranged on the circumference at even intervals.

10. The image pickup apparatus according to claim 1, wherein the optical system and cover member are integrally formed of a single piece.

* * * * *